(12) United States Patent
Senba et al.

(10) Patent No.: US 6,486,540 B2
(45) Date of Patent: Nov. 26, 2002

(54) THREE-DIMENSIONAL SEMICONDUCTOR DEVICE AND METHOD OF MANUFACTURING THE SAME

(75) Inventors: Naoji Senba, Tokyo (JP); Takao Yamazaki, Tokyo (JP); Yuzo Shimada, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/829,945

(22) Filed: Apr. 11, 2001

(65) Prior Publication Data

US 2002/0022303 A1 Feb. 21, 2002

(30) Foreign Application Priority Data

Apr. 13, 2000 (JP) ......................................... 2000/112151

(51) Int. Cl.⁷ ............................................. H01L 23/02
(52) U.S. Cl. ........................ 257/678; 257/685; 257/687; 257/712
(58) Field of Search ........................ 438/109; 257/678, 257/684, 685, 686, 687, 712, 714, 717, 723, 777

(56) References Cited

U.S. PATENT DOCUMENTS 4,868,712 A * 9/1989 Woodman .................... 361/388

FOREIGN PATENT DOCUMENTS

JP            9-246466        9/1997

* cited by examiner

Primary Examiner—Michael Sherry
Assistant Examiner—Scott Geyer
(74) Attorney, Agent, or Firm—McGinn & Gibb, PLLC (57) ABSTRACT

A three-dimensional semiconductor device includes a cylindrical heat sink, wherein a CPU is provided on a substantially center of an inner bottom surface of the cylindrical heat sink, semiconductor chips are respectively mounted on an outer peripheral surface and an inner peripheral surface of the cylindrical heat sink, and the CPU is connected to an upper heat sink.

28 Claims, 9 Drawing Sheets

FIG.1A

PLAN VIEW

FIG.1B

A-A' CROSS-SECTIONAL VIEW

PARTIAL PLAN VIEW EXCLUDING AN A PORTION

14 SEMICONDUCTOR CHIP-3
13 HEAT SINK-7
16 CPU-2

FIG.3B

SIDE VIEW

15 A PORTION

FIG.4A

PARTIAL PLAN VIEW EXCLUDING AN A PORTION

17 SEMICONDUCTOR CHIP-4

FIG.4B

CROSS-SECTIONAL VIEW

FIG.5A

SEMICONDUCTOR CHIPS-1
AND 2 ARE ATTACHED TO
A HEAT SINK PLATE
(BOTH SURFACES)

FIG.5B

A CPU IS ATTACHED TO A HEAT
SINK PLATE

FIG.5C

A HEAT SINK IS ATTACHED
TO A CPU

FIG.5D

SEMICONDUCTOR CHIP
BLOCKS AND A CPU
ARE COMBINED

18
SEMICONDUCTOR CHIP BLOCK

FIG.5E

THREE-DIMENSIONAL
SEMICONDUCTOR
DEVICE (A PORTION OMITTED)

FIG.6A
SEMICONDUCTOR CHIPS ARE ATTACHED ONTO AN OUTER CURVED SURFACE

19 ADHESIVE

FIG.6B
SEMICONDUCTOR CHIP ARE ATTACHED ONTO AN INNER CURVED SURFACE

FIG.6C
A CPU IS ATTACHED

FIG.6D
A HEAT SINK IS ATTACHED ONTO A CPU (B-B' CROSS-SECTION)

FIG.6E
THREE-DIMENSIONAL SEMICONDUCTOR DEVICE

FIG.7A
AN ADHESIVE IS FORMED ON THE OUTER SURFACE

19 ADHESIVE   20 ADHESIVE TRANSFER ROLLER FOR OUTER SURFACE

FIG.7B
SEMICONDUCTOR CHIPS ARE ATTACHED OR CONNECTED

21 ELASTIC STRUCTURE

22 ATTACHMENT OR CONNECTION ROLLER FOR OUTER SURFACE

FIG.7C
AN ADHESIVE IS FORMED ON THE INNER SURFACE

23 ADHESIVE TRANSFER ROLLER FOR INNER SURFACE

FIG.7D
SEMICONDUCTOR CHIPS ARE ATTACHED OR CONNECTED TO THE INNER SURFACE

24 ATTACHMENT OR CONNECTION ROLLER FOR INNER SURFACE

ALUMINIUM MATERIAL
PROVIDED WITH Cu/Al
CLADDINGS ON BOTH

- 32
- 30 Cu CLADDING
- 31 ALUMINUM
- 30
- 32 Al CLADDING
- 30
- 31
- 30

FIG.9B

OXIDATION OF THE SURFACE
OF THE Al CLADDING 33    33 ALUMINIUM OXIDE

FIG.9C

FORMATION OF AN
INSULATING LAYER

- 35
- 34 INSULATING RESIN LAYER
- 35 Cu FOIL CIRCUIT PATTERN
- 36 OPENING FOR MOUNTING A SEMICONDUCTOR CHIP

FIG.10

THREE-DIMENSIONAL SEMICONDUCTOR DEVICE AND METHOD OF MANUFACTURING THE SAME

BACKGROUND OF THE INVENTION

1. Field of the Invention

The present invention relates to a three-dimensional semiconductor device and a method of manufacturing the same.

2. Description of the Related Art

Figure 10:
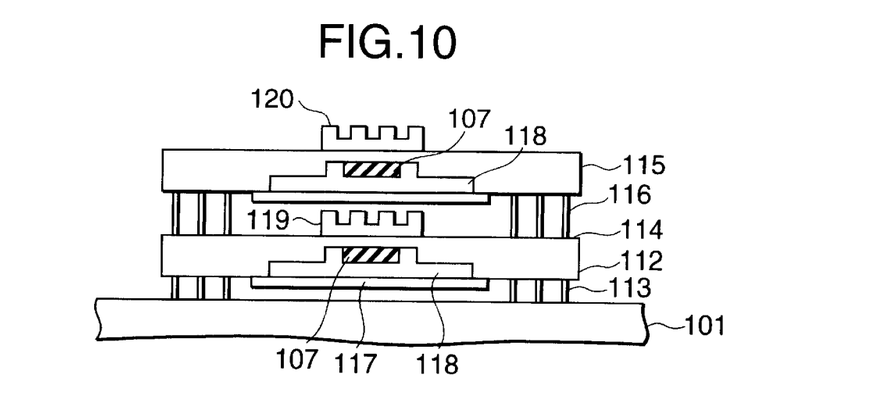
FIG. 10 is a schematic cross-sectional view of a conventional semiconductor device in a thickness direction of an IC package.

A conventional semiconductor device having a heat transfer structure is disclosed in Japanese Patent Application Laid-open No. Hei. 9-246466, as shown in FIG. 10. FIG. 10 is a schematic cross-sectional view of the conventional semiconductor device in a thickness direction of an IC package 112. The conventional semiconductor device shown in FIG. 10 will be described as follows.

The IC package 112 is provided with an IC chip 107 in a cavity 118. The IC chip 107 is electrically and mechanically connected to the IC package 112, and sealed off by a cap 117 in a hollow state. A radiating fin 119 is attached on to a surface of the IC package 112 opposite to a surface on which the IC chip 107 is mounted. The radiating fin 119 is placed on the IC package 112 in a position identical to that of the IC chip 107 in a thickness direction, in such a manner that the radiating fin 119 overlaps the IC chip 107 via the IC package 112 in a thickness direction of the IC chip 107.

Furthermore, on the reverse surface of the IC package 112 (i.e., the surface of the IC package 112 to which the radiating fin 119 is attached), a land 114 is formed for electrically and mechanically connecting the IC package 112 to an IC package 115 having substantially the same structure as that of the IC package 112 with long pins 116. On the under surface of the IC package 112, pins 113 are formed for electrical and mechanical connection to a mounting substrate 101. Thus, the first-stage IC package 112 close to the mounting substrate 101 is constructed.

Next, the second-stage IC package 115 is provided with an IC chip 107 in a cavity 118. The IC chip 107 is electrically and mechanically connected to the IC package 115. In the IC package 115, the IC chip 107 is sealed off in the cavity 118 in a hollow state, in the same way as in the IC package 112.

A radiating fin 120 is attached onto a surface of the IC package 115 opposite to a surface on which the IC chip 107 is mounted. The radiating fin 120 is placed on the IC package 115 in a position identical to that of the IC chip 107 in a thickness direction, in such a manner that the radiating fin 120 overlaps the IC chip 107 via the IC package 115 in a thickness direction of the IC chip 107. Furthermore, on the under surface of the IC package 115, long pins 116 are formed for electrically and mechanically connecting the IC package 115 to the IC package 112. The conventional semiconductor device having a heat transfer structure. is constructed in such a manner that the IC packages 112 and 115 are mounted on the mounting substrate 101 so as to be stacked on top of the other.

Because of the above-mentioned structure, the conventional semiconductor device having a heat transfer structure allows air to flow freely through a space between the respective IC packages and does to be attached a heat sink such as a radiating fin, so that a heat transfer property can be substantially improved.

In the above-mentioned prior art, IC packages provided with semiconductor devices in cavities are stacked on top of another via pins and long pins. A large space is kept between the first-stage IC package and the second-stage IC package by using long pins so as to attach a radiating fin to the first-stage IC package, and the second-stage IC package is also provided with a radiating fin.

Consequently, the above-mentioned prior art has the following problems. An IC package has a size much larger than that of the semiconductor device, resulting in a decrease in a packaging density. Furthermore, a wiring length between the semiconductor devices is long, which makes it impossible to realize a high-speed operation. Furthermore, in a multi-stage three-dimensional semiconductor device, a wiring length is large, so that electrical characteristics are degraded. Furthermore, since the entire semiconductor device becomes very long, mechanical characteristics are also degraded. A heat transfer region is only limited to an IC package and a radiating fin, so that heat transfer to a mother board and a housing cannot be expected, which leads to a decrease in a heat transfer effect. Since a semiconductor device cannot be mounted on a curved surface, its mounting place is limited to a flat surface.

SUMMARY OF THE INVENTION

An object of the present invention is to provide a three-dimensional semiconductor device with which at least one of the above-mentioned problems maybe solved. Also, the present invention. has an object to provide a method of manufacturing the three-dimensional semiconductor device. Further, the present invention has an object to provide an apparatus for manufacturing the three-dimensional semiconductor device.

The three-dimensional semiconductor device according to a first aspect of the present invention includes: a supporting member having a three-dimensional shape allowing a plurality of semiconductor devices to be arranged in a columnar shape and containing as a main component a high heat-conductive material; and a plurality of semiconductor devices attached to the supporting member.

The method of manufacturing a three-dimensional semiconductor device according to a second aspect of the present invention includes the step of combining members having semiconductor devices attached thereto and containing as the main component a high heat-conductive material, thereby obtaining a three-dimensional semiconductor device including a supporting member that has a three-dimensional shape allowing a plurality of semiconductor devices to be arranged in a columnar shape and contains as the main component a high heat-conductive material, and a plurality of semiconductor devices attached to the supporting member.

The method of manufacturing a three-dimensional semiconductor device according to the third aspect of the present invention includes the step of attaching a plurality of semiconductor devices to a supporting member that has a three-dimensional shape allowing a plurality of semiconductor devices to be arranged in a columnar shape and that contains as the main component a high heat-conductive material.

The apparatus for manufacturing a three-dimensional semiconductor device according to a fourth aspect of the present invention includes: a stage having a surface for allowing a cylindrical structure containing as the main component a high heat-conductive material to come into contact with; a bonding head for bonding a semiconductor device to an inner peripheral surface or an outer peripheral surface of the cylindrical structure by flip-chip bonding; and rotation means for rotating the cylindrical structure on a central axis thereof and pressing the cylindrical structure perpendicularly to the stage surface.

Thus, the invention described herein makes possible the advantages of (1) providing a three-dimensional semiconductor device that overcomes at least one of the above-mentioned problems, (2) providing a method of manufacturing the three-dimensional semiconductor device, and (3) providing an apparatus for manufacturing the three-dimensional semiconductor device.

These and other advantages of the present invention will become apparent to those skilled in the art upon reading and understanding the following detailed description with reference to the accompanying figures.

BRIEF DESCRIPTION OF THE DRAWINGS

In the accompanying drawing:

FIGS. 5A to 5E show a production process-1 for a three-dimensional semiconductor device, which is a method of manufacturing a three-dimensional semiconductor device of the fifth example according to the present invention. More specifically.

FIGS. 6A to 6E show a production process-2 for a three-dimensional semiconductor device, which is a method of manufacturing a three-dimensional semiconductor device of the sixth example according to the present invention. More specifically.

FIG. 8 is a schematic view seen from axial direction of a cylindrical heat sink, illustrating a method for continuously bonding semiconductor chips on inner and outer peripheral curved surfaces of a cylindrical heat sink by flip-chip bonding;

DETAILED DESCRIPTION OF THE PREFERRED EMBODIMENTS

The present invention will be described by way of illustrative embodiments.

Three-dimensional Semiconductor Device

The supporting member of the three-dimensional semiconductor device of the present invention may have a three-dimensional shape that allows a plurality of semiconductor devices to be arranged in a columnar shape. For example, the supporting member can be formed into a columnar shape with a circular, elliptical, and polygonal cross-section in a diameter direction. The supporting member may also have a discontinuous cross-section in a diameter direction, such as a C-shaped or substantially U-shaped cross-section. Furthermore, a supporting member having a columnar or substantially columnar contour may be used.

The supporting member of the three-dimensional semiconductor device of the present invention may contain as the main component a material of high thermal conductivity. Examples of the high heat-conductive material include aluminum (thermal conductivity: about 236 $W·m^{-1}·k^{-1}$ at 0° C.) or a metal material having a thermal conductivity equal to or higher than that of aluminum, AlN (thermal conductivity: about 200 $W·m^{-1}·k^{-1}$ at 27° C.) or a ceramic material having a thermal conductivity equal to or higher than that of AlN. The supporting member can have a high heat transfer property by containing as the main component a material with a thermal conductivity α of 200 $W·m^{-1}·k^{-1}$ or higher at room temperature, preferably in an amount of at least 60% by weight, more preferably at least 80% by weight, and most preferably at least 90% by weight. The thermal conductivity α of the supporting member can be prescribed to be at least 180 $W·m^{-1}·k^{-1}$ at room temperature, preferably at least 200 $W·m^{-1}·k^{-1}$, and more preferably at least 230 $W·m^{-1}·k^{-1}$. Furthermore, the heat transfer property of the metal material can be used for a heat sink. A plurality of semiconductor devices in the three-dimensional semiconductor device of the present invention can be arranged on the supporting member in a columnar shape. The semiconductor devices in the three-dimensional semiconductor device of the present invention can be mounted in the form of semiconductor chips.

The supporting member of the three-dimensional semiconductor device of the present invention may include a columnar structure. At least one end of the columnar structure may have a bottom. A plurality of semiconductor devices can be mounted on at least one of an inner bottom surface, an inner peripheral surface, and an outer peripheral surface of the columnar structure. Furthermore, the supporting member may include a columnar structure having a bottom at least on one end, wherein a CPU is mounted on the inner bottom surface of the columnar structure, semiconductor devices controlled by the CPU are mounted on at least one of an inner peripheral surface and an outer peripheral surface of the columnar structure, and the CPU has a heat sink on its surface that is not in contact with the inner bottom surface of the columnar structure.

The columnar structure having a bottom on one end may be constructed in liquid-tight in such a manner that a liquid cooling medium for cooling semiconductor devices can be stored in an inner cavity. Furthermore, the columnar structure may have an inlet/outlet port for supplying the cooling medium to the inner cavity or discharging the cooling medium from the inner cavity. For example, at least one inlet/outlet port can be provided in the vicinity of the bottom surface of the columnar structure, aside from an opening end of the columnar structure. An inlet port and an outlet port can be separately provided. Furthermore, the supporting member may have a circuit pattern with conductivity via an insulating layer. Furthermore, the supporting member may be formed of a Cu/Al cladding material in which a layered structure including a Cu cladding layer and an Al cladding layer is formed on both sides of a metal layer having high thermal conductivity so that the Al cladding layer becomes an outermost layer. (Method of manufacturing a three-dimensional semiconductor device)

The method of manufacturing a three-dimensional semiconductor device of the first embodiment according to the present invention may include at least the step of attaching a plurality of semiconductor device blocks to an outer peripheral portion of a base plate, thereby forming a columnar structure having a bottom on one end, the base plate mainly containing a high heat-conductive material and having a central processing unit (CPU) electrically and mechanically attached thereto, each semiconductor device block including a plate mainly containing a high heat-conductive material and having at least one semiconductor device electrically and mechanically attached thereto.

Furthermore, the method of manufacturing a three-dimensional semiconductor device of the first embodiment according to the present invention may include, before the step of forming a columnar structure, the steps of electrically and mechanically attaching a semiconductor device to a plate mainly containing a high heat-conductive material to obtain a semiconductor device block, and electrically and mechanically attaching a CPU to a plate mainly containing a high heat-conductive material. These two steps may be conducted simultaneously, or either one of them may be conducted in advance. Furthermore, the method may include, before or after the step of forming a columnar structure, the step of attaching a heat sink to the CPU. Furthermore, the method may include, after the step of forming a columnar structure, the step of electrically and mechanically inspecting the semiconductor device and the CPU of the columnar structure obtained in the step of forming a columnar structure.

According to the method of manufacturing a three-dimensional semiconductor device of the first embodiment according to the present invention, a heat sink circuit board can be used as the plate mainly containing a high heat-conductive material, the heat sink circuit board being obtained by forming a conductive circuit pattern via an insulating layer on a first layered structure with high heat-conductive including a first metal layer as an outermost layer on at least one side or on a second layered structure having high heat-conductive including a second metal layer to be layered on the first metal layer as an outermost layer on at least one side. The first metal of the first metal layer may be Cu, and the second metal of the second metal layer may be Al.

The method of manufacturing a three-dimensional semiconductor device of the first embodiment according to the present invention may include the process of producing a heat sink circuit board, including the steps of forming insulating layers on the surfaces of outermost layers of a Cu/Al cladding material having a layered structure of a Cu cladding layer and an Al cladding layer on both sides so that the Al cladding layers become outermost layers or on the surfaces of outermost layers of a Cu cladding material having Cu cladding layers on both sides as outermost layers, and the step of forming conductive layers on the insulating layers formed in the step of forming an insulating layer, thereby forming circuit patterns with conductivity from the conductive layers. The method may include, before the step of forming an insulating layer, the step of forming aluminum oxide layers on the surfaces of the Al cladding layers of the Cu/Al cladding material.

The method of manufacturing a three-dimensional semiconductor device of the second embodiment according to the present invention may include at least the step of electrically and mechanically attaching a CPU to an inner bottom surface of a columnar structure mainly containing a high heat-conductive material and having a bottom on one end, and electrically and mechanically attaching a semiconductor device to at least one of an inner peripheral surface and an outer peripheral surface of the columnar structure. The order in which the CPU and the semiconductor device are attached can be appropriately selected depending upon the shape of the columnar structure. Furthermore, the method may include, before or after the attaching step, the step of attaching a heat sink to the CPU before or after being attached to the columnar structure. Furthermore, the method may include, after the attaching step, the step of electrically and mechanically inspecting the CPU and the semiconductor device attached to the columnar structure.

The method of manufacturing a three-dimensional semiconductor device of the third embodiment according to the present invention includes at least the step of attaching a semiconductor device to at least one of an inner peripheral surface and an outer peripheral surface of a cylindrical structure mainly containing a high heat-conductive material, and the attaching step may include the steps of transferring an adhesive attached to a rotating transfer roller to at least one of an inner peripheral surface and an outer peripheral surface of the cylindrical structure rotating on its central axis, thereby forming an adhesive layer, and attaching a semiconductor device to the adhesive layer with a rotating roller having elasticity at least on an outer peripheral surface. The transfer roller and the roller having elasticity may have a cylindrical shape, and may be rotated on a central axis of a cylinder.

The method of manufacturing a three-dimensional semiconductor device of the fourth embodiment according to the present invention includes at least the step of attaching, by flip-chip bonding, a plurality of semiconductor devices to a cylindrical structure mainly containing a high heat-conductive material in a circumferential direction of an inner peripheral surface or an outer peripheral surface of the cylindrical structure, while contacting or pressing the cylindrical structure onto a stage surface. In the attaching step, the cylindrical structure is rotated on its central axis so that the pressed direction of the semiconductor device onto the inner peripheral surface or the outer peripheral surface of the cylindrical structure is perpendicular to the stage surface, thereby conducting flip-chip bonding.

At least one of the three-dimensional semiconductor device of the present invention and the three-dimensional semiconductor device obtained by the method of manufacturing a three-dimensional semiconductor device of the present invention is mounted in a package, whereby a three-dimensional semiconductor device package can be obtained.

Hereinafter, the present invention will be described by way of illustrative examples with reference to the drawings.

EXAMPLES

Example 1

Figure 1A:
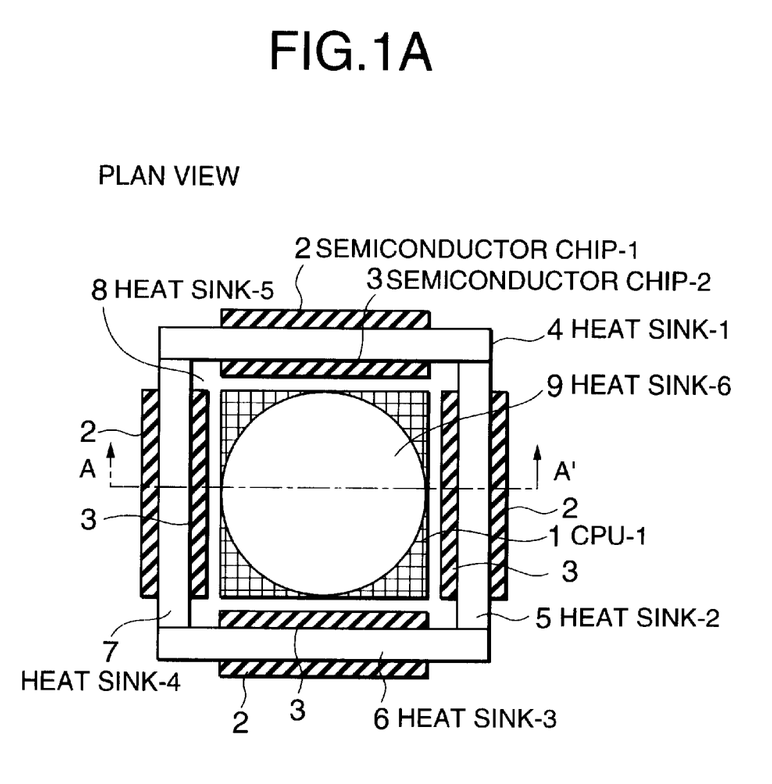
FIG. 1A is a plan view (seen from a direction perpendicular to a plate-shaped CPU-1) showing a three-dimensional semiconductor device of the first example according to the present invention.
Figure 1B:
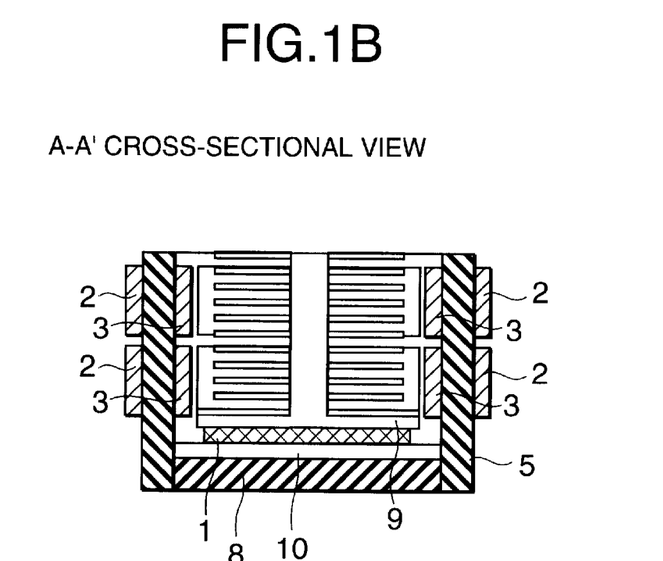
FIG. 1B is a cross-sectional view taken along a line A–A' in FIG. 1A.

FIG. 1A is a plan view of a three-dimensional semiconductor device of the first example according to the present invention (seen from a vertical direction to a plate-shaped CPU-1), and FIG. 1B a cross-sectional view taken along a line A–A' in FIG. 1A. In the three-dimensional semiconductor device of the first example, semiconductor devices are provided on an inner bottom surface, inner peripheral surface, and an outer peripheral surface of a columnar heat sink having a rectangular cross-section in a diameter direction. In FIGS. 1A and 1B, a circuit board 10 having a circuit pattern is attached to a heat sink-5 8. In the case where a circuit pattern is formed directly on the heat sink-5 8, the circuit board 10 is not required. A CPU-1 1 is mounted on the circuit board 10 so as to be electrically and mechanically connected thereto. A "CPU" refers to a "central processing unit".

Next, two semiconductor chips-1 2 and two semiconductor chips-2 3 are mounted respectively on an outer surface and an inner surface of a heat sink-1 4, a heat sink-2 5, a heat sink-3 6, and a heat sink-4 7 so as to be electrically and mechanically connected thereto. Accordingly, the heat sinks-1 to 4 denoted by reference numerals 4 to 7 are provided with 16 semiconductor chips in total, four semiconductor chips in total being mounted on both sides of each heat sink.

Since a circuit pattern (not shown) is formed directly on the heat sinks-1 to 4 (reference numerals 4 to 7), a circuit board is not required. Four semiconductor blocks with a heat sink on which the semiconductor chips-1 and 2 (reference numerals 2 and 3) are mounted are attached to the heat sink-5 8 perpendicularly to surround the CPU-1 1.

The semiconductor blocks with a heat sink are attached to the heat sink-5 8 by fitting with the use of fitting grooves formed in each heat sink, connecting with low melting point solder, connecting with the use of high heat-conductive resin or the like. and finally, an upper heat sink-6 9 for the CPU-1 1 is connected to the CPU-1 1 by using low melting point solder, high heat-conductive resin or the like. Thus, a miniaturized three-dimensional semiconductor device is obtained, in which the semiconductor chip of the CPU-1 1 is included as a core, and a packaging with high heat transfer and high density can be realized. By adopting this structure, the distance between the CPU-1 1 and the semiconductor chip-1 2, and the distance between the CPU-1 1 and the semiconductor chip-2 3 become almost equal, so that an electrically stable circuit can be obtained, and a high-speed operation can be realized.

Example 2

Figure 2:
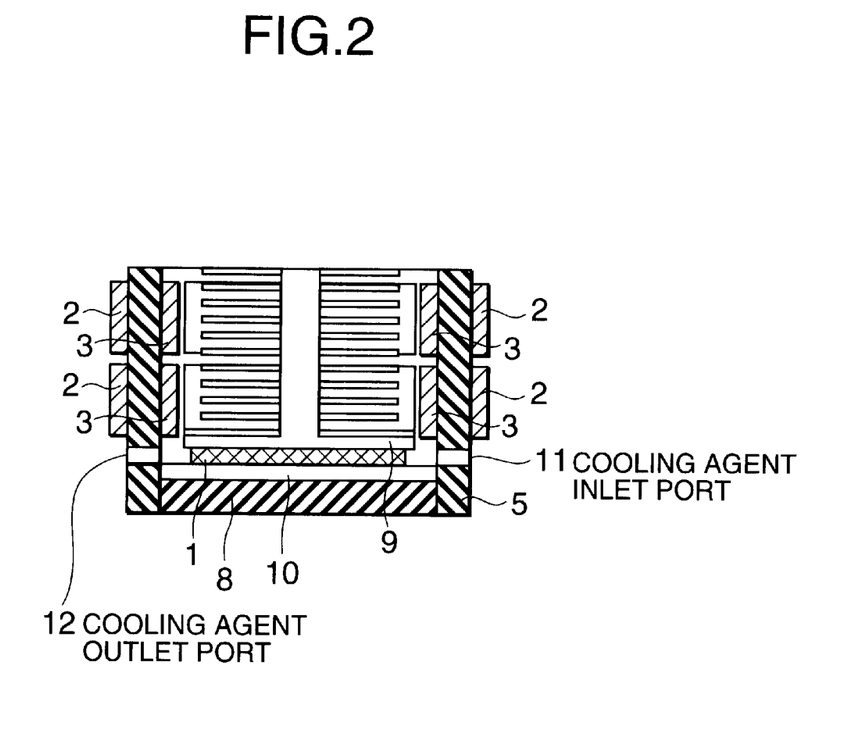
FIG. 2 is another cross-sectional view taken along a line A–A' in FIG. 1A, showing a three-dimensional semiconductor device of the second example according to the present invention.

FIG. 2 shows a three-dimensional semiconductor device of the second example according to the present invention.

FIG. 2 is another cross-sectional view taken along the line A–A' in FIG. 1A, illustrating a modified structure of the first example. As shown in FIG. 2, the three-dimensional semiconductor device of the second example includes a cooling agent inlet port 11 and a cooling agent outlet port 12 in addition to the structure described in the first example. In this structure, a cooling method with a high cooling effect, such as forced air cooling and forced liquid cooling, as well as natural air cooling can be adopted.

Example 3

Figure 3A:
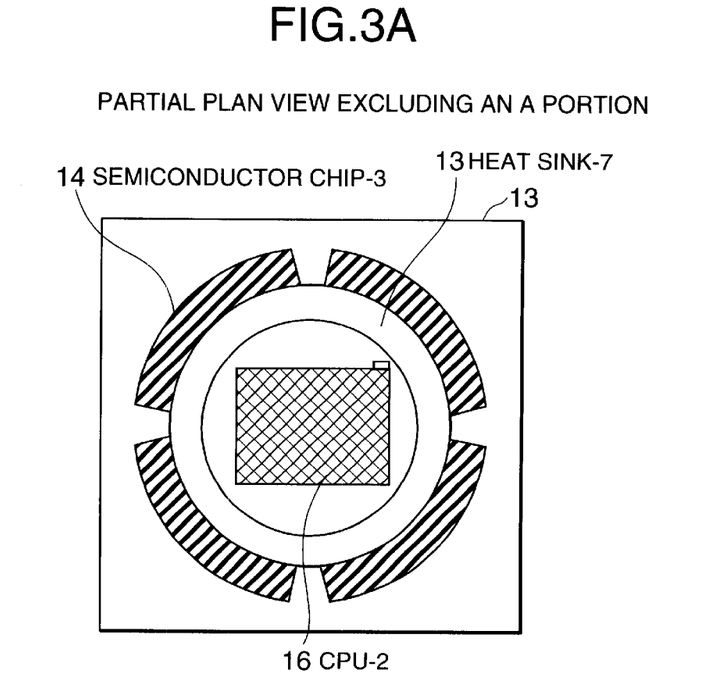
FIG. 3A is a plan view of a three-dimensional semiconductor device of the third example according to the present invention, excluding an upper heat sink A portion, seen from axial direction of a cylindrical heat sink.
Figure 3B:
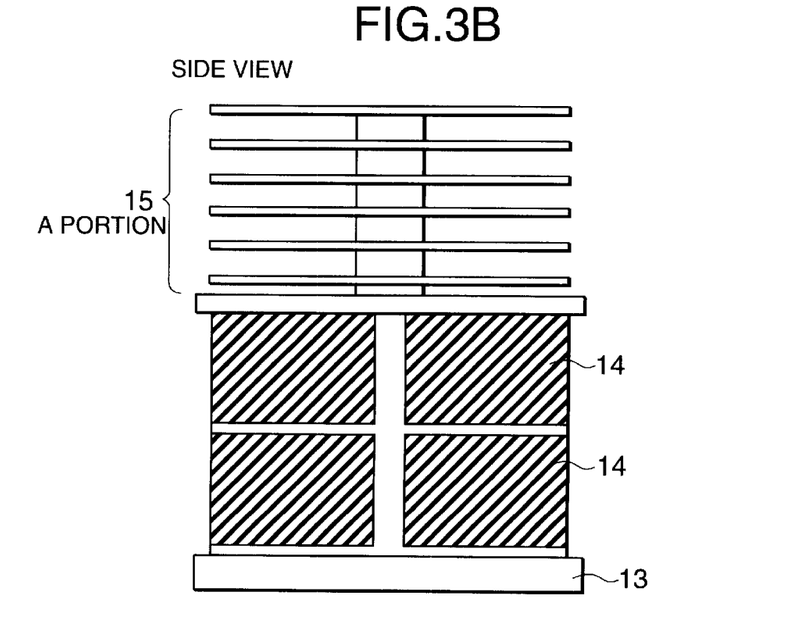
FIG. 3B is a side view of a three-dimensional semiconductor device of the third example according to the present invention, seen from an outer peripheral surface of the heat sink.

FIG. 3A is a partial plan view of a three-dimensional semiconductor device of the third example according to the present invention, excluding an upper heat sink A portion 15, seen from axial direction of a cylindrical heat sink-7 13. FIG. 3B is a side view of the three-dimensional semiconductor device of the third example. In the third example, semiconductor devices are mounted on an inner bottom surface and an outer peripheral surface of the cylindrical heat sink.

A CPU-2 16 is mounted on a substantially center of the inner bottom surface of the heat sink-7 13 so as to be electrically and mechanically connected thereto. In the case where a circuit pattern is not formed directly on the heat sink-7 13, a circuit board is attached to the heat sink-7 13, and thereafter, the CPU-2 16 is mounted on the circuit board. In the case where a circuit pattern is formed directly on the heat sink-7 13, a circuit board is not required.

Next, semiconductor chips-3 14 are mounted on an outer peripheral surface of the heat sink 7 13 so as to be electrically and mechanically connected thereto. Semiconductor chips-3 14 are arranged in two stages on the outer peripheral surface along axial direction. Thus, eight semiconductor chips are mounted on the outer peripheral surface of the heat sink-7 13. Since a circuit pattern (not shown) is formed directly on the heat sink-7 13, a circuit board is not required.

Finally, the upper heat sink A portion 15 for the CPU-2 16 is connected to the surface of the CPU-2 16 by connecting with low melting point solder, high heat-conductive resin or the like. The upper heat sink A portion 15 has a columnar part (not shown), and an end of the columnar part is connected to the surface of the CPU-2 16. Thus, a miniaturized three-dimensional semiconductor device can be obtained, in which the semiconductor chip of the CPU-2 16 is included as a core, and a packaging with high heat transfer and high density can be realized. By adopting this structure, the distance between the CPU-2 16 and each semiconductor chip-3 14 becomes substantially equal, so that an electrically stable circuit can be obtained, and a high-speed operation can be realized.

Example 4

Figure 4A:
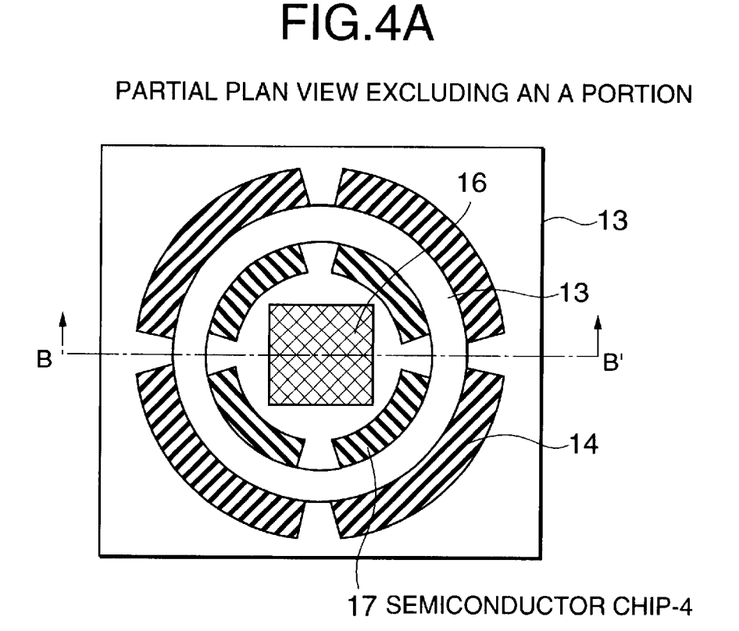
FIG. 4A is a plan view of a three-dimensional semiconductor device of the fourth example according to the present invention, excluding an upper heat sink A portion, seen from axial direction of a cylindrical heat sink.
Figure 4B:
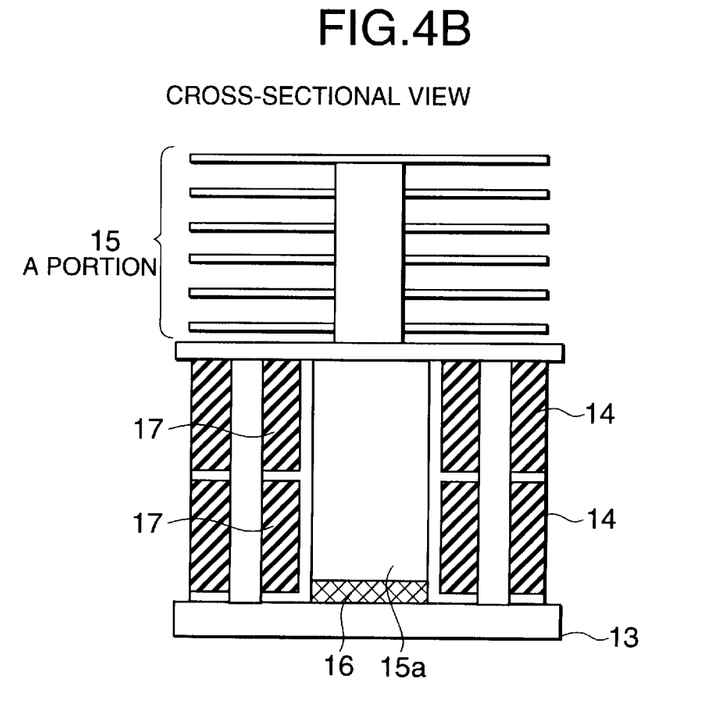
FIG. 4B is a cross-sectional view (including a cross-section of the upper heat sink A portion) taken along a line B–B' in FIG. 4A.

FIG. 4A is a partial plan view of a three-dimensional semiconductor device of the fourth example according to the present invention, excluding an upper heat sink A portion 15, seen from axial direction of a cylindrical heat sink-7 13. FIG. 4B is a cross-sectional view (including a cross-section of the upper heat sink A portion 15) taken along a line B–B' in FIG. 4A. In the three-dimensional semiconductor device of the fourth example, semiconductor devices are mounted on an inner bottom surface, an outer peripheral surface, and an inner peripheral surface of the cylindrical heat sink-7 13. The fourth example of the present invention shown in FIGS. 4A and 4B has a structure of higher density packaging, compared with the third example.

ACPU-2 16 is mounted on a substantially center of an inner bottom surface of the heat sink-7 13 so as to be electrically and mechanically connected thereto. In the case where a circuit pattern is not formed directly on the heat sink-7 13, a circuit board is attached to the heat sink-7 13, and thereafter, the CPU-2 16 is mounted on the circuit board. In the case where a circuit pattern is formed directly on the heat sink-7 13, a circuit board is not required.

Next, semiconductor chips-3 14 are mounted in two stages on an outer peripheral surface of the heat sink-7 13 along axial direction so as to be electrically and mechanically connected thereto. Furthermore, semiconductor chips-4 17 are mounted in two stages on an inner peripheral surface of the heat sink-7 13 along axial direction so as to be electrically and mechanically connected thereto. Thus, the heat sink-7 13 is provided with 16 semiconductor chips in total on the inner and outer peripheral surfaces. Since a circuit pattern (not shown) is formed directly on the heat sink-7 13, a circuit board is not required.

Finally, the upper heat sink A portion 15 for the CPU-2 16 is connected to the surface of the CPU-2 16 by connecting with low melting point solder, high-heat conductive resin or the like. The upper heat sink A portion 15 has a columnar part 15a, the end of which is connected to the surface of the CPU-2 16. Thus, a miniaturized three-dimensional semiconductor device can be obtained, in which the semiconductor chip of the CPU-2 16 is included as a core, and a packaging with high heat transfer and high density can be realized. By adopting this structure, the distance between the CPU-2 16 and each semiconductor chip-3 14 and that between the CPU-2 16 and each semiconductor chip-4 17 become substantially equal, so that an electrically stable circuit can be obtained, and a high-speed operation can be realized.

A semiconductor chip will naturally warp when processed to be thin. For example, in the case of silicon, when the total length of a semiconductor device is about 15 mm, and the thickness thereof is about 50 $\mu$m, the semiconductor device will warp about 0.8 mm. Similarly, when the total length of a semiconductor device is about 15 mm, and the thickness thereof is about 20 $\mu$m, the semiconductor will warp about 2.0 mm. Even if such a warp occurs, electrical characteristics of a semiconductor chip will not be changed. The structure of the present example has been achieved by utilizing such a characteristic. Therefore, these kind of structures can realize amounting on a curved surface, and realize ample scope for application. Thus, packaging with high heat transfer and high density is realized, which can be used for a high-speed operation even in a cylindrical package.

Example 5

Figure 5A:
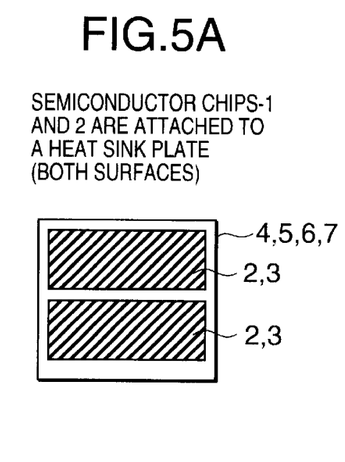
FIG. 5A is a plan view of a heat sink plate with semiconductor chips attached thereto on both sides, seen from a thickness direction of the heat sink plate.

FIGS. 5A to 5E show a production process-1 for a three-dimensional semiconductor device, which is a method of manufacturing a three-dimensional semiconductor device of the fifth example according to the present invention. More specifically, FIG. 5A is a plan view of a heat sink plate with semiconductor chips attached thereto on both sides, seen from a thickness direction of the heat sink plate. FIGS. 5B to 5E are plan views each showing the production process-1, seen from a thickness direction of a heat sink plate with a CPU attached thereto.

In FIG. 5A, semiconductor chips-1 and 3 denoted by reference numerals 2 and 3 are mounted in two stages on both surfaces of a heat sink-1 4, a heat sink-2 5, a heat sink-3 6, and a heat sink-4 7 in a parallel direction to the respective surfaces of the heat sinks, whereby electrically and mechanically connected semiconductor chip blocks 18 are constructed.

Figure 5B:
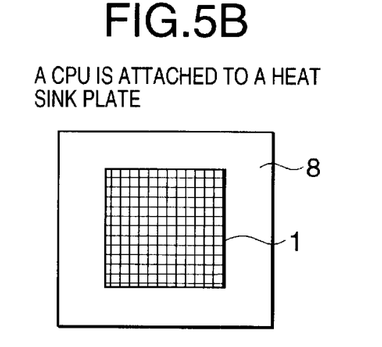
FIGS. 5B to 5E are plan views each showing the production process-1 for a three-dimensional semiconductor device, seen from a thickness direction. of a heat sink plate with a CPU attached thereto.
Figure 5C:
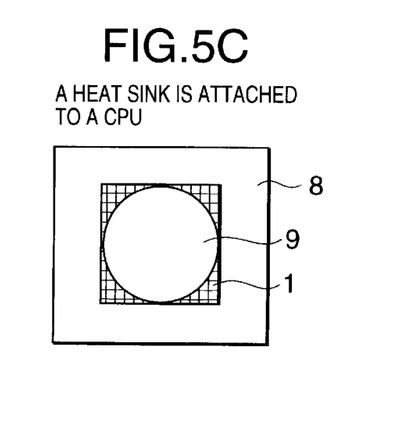
Figure 5D:
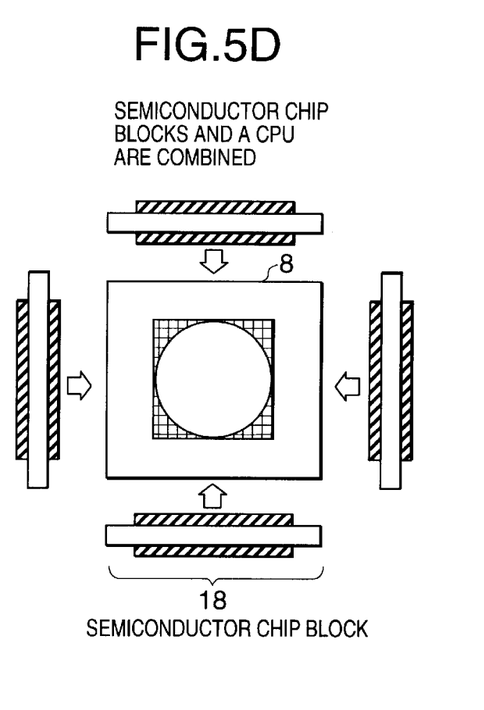
Figure 5E:
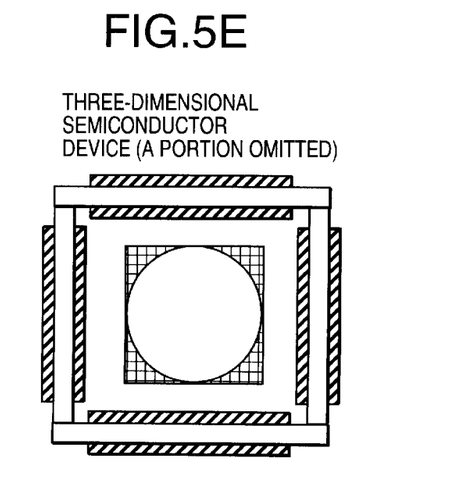

Next, as shown in FIG. 5B, a CPU-1 1 is mounted on a substantially center of a square plate-shaped heat sink-5 8 so as to be electrically and mechanically connected thereto. As shown in FIG. 5C, a heat sink-6 9 is connected to the upper surface of the CPU-1 1 by connecting with low melting point solder, high heat-conductive resin or the like. The heat sink-6 9 may be attached in the last step. As shown in FIG. 5D, four semiconductor chip blocks 18 are attached to ends of the heat sink-5 8 in four directions with respect to the CPU-1 1. The semiconductor chip blocks 18 may be connected to the heat sink-5 8 by fitting grooves formed in each heat sink, connecting with low melting point solder, high heat-conductive resin or the like. As shown in FIG. 5E, a three-dimensional semiconductor device having a columnar structure having a rectangular cross-section in a diameter direction is obtained.

Example 6

Figure 6A:
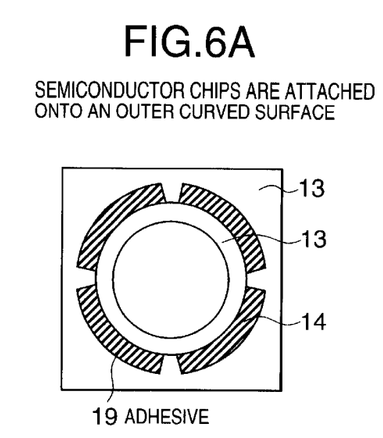
FIGS. 6A to 6C are plan views showing the production process-2, seen from axial direction of a cylindrical heat sink.
Figure 6B:
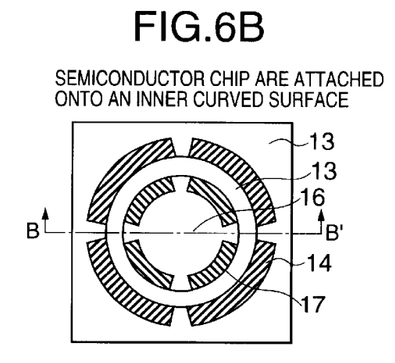
Figure 6C:
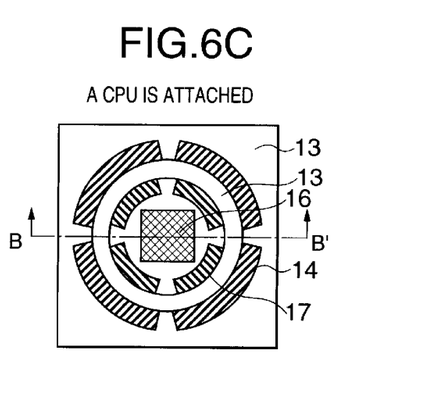
Figure 6D:
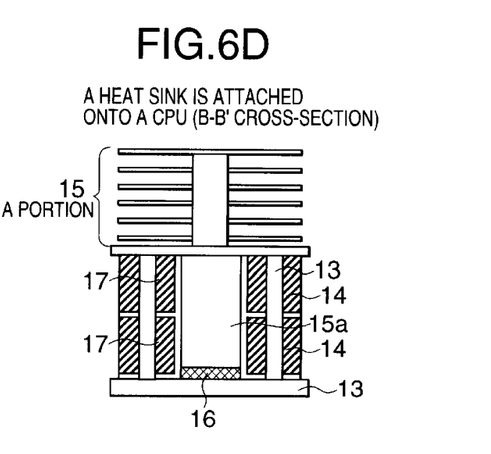
FIG. 6D is a cross-sectional view taken along a line B–B' in FIG. 6C.
Figure 6E:
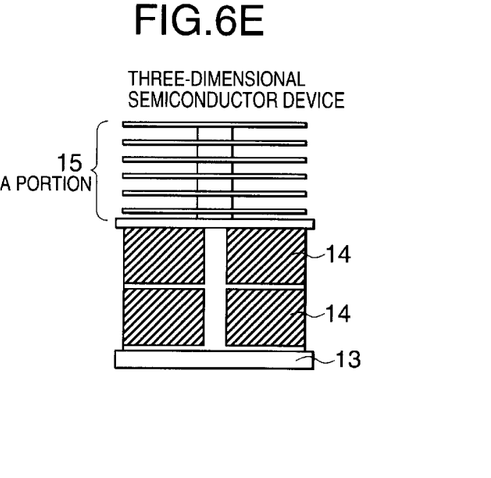
FIG. 6E is a side view of a three-dimensional semiconductor device produced by the production process-2 for a three-dimensional semiconductor, seen from a direction perpendicular to a central axis of the cylindrical heat sink.

FIGS. 6A to 6E show a production process-2 for a three-dimensional semiconductor device, which is a method of manufacturing a three-dimensional semiconductor device of the sixth example according to the present invention. More specifically, FIGS. 6A to 6C are plan views showing the production process-2, seen from axial direction of a cylindrical heat sink-7 13. FIG. 6D is a cross-sectional view taken along a line B–B' in FIG. 6C. FIG. 6E is a side view of a three-dimensional semiconductor device produced by the production process-2, seen from a direction perpendicular to a central axis of the cylindrical heat sink-7 13.

As shown in FIG. 6A, semiconductor chips-3 14 are attached onto an outer peripheral surface of the heat sink-7 13 in two stages along axial direction of the cylinder with an adhesive 19, so as to be electrically and mechanically connected thereto.

Next, as shown in FIG. 6B, semiconductor chips-4 17 are attached onto an inner peripheral surface of the heat sink-7 13 in two stages along axial direction of the cylinder with an adhesive 19, so as to be electrically and mechanically connected thereto. Since a circuit pattern (not shown) is formed directly on the heat sink-7 13, so that a circuit board is not required. As shown in FIG. 6C, a CPU-2 16 is mounted on a substantially center of an inner bottom surface of the heat sink-7 13 so as to be electrically and mechanically connected thereto.

Finally, as shown in FIG. 6D, an upper heat sink A portion 15 for the CPU-2 16 is connected to the surface of the CPU-2 16 by connecting with low melting point solder, high heat-conductive resin or the like. The upper heat sink A portion 15 has a columnar part 15a, the end of which is connected to the surface of the CPU-2 16. Thus, a miniaturized three-dimensional semiconductor device shown in FIG. 6E is obtained, in which the semiconductor chip of the CPU-2 16 is included as a core, and a packaging with high heat transfer and high density can be realized.

Example 7

FIGS. 7A to 7D show a process of mounting a semiconductor chip on a curved surface, which is a method of manufacturing a three-dimensional semiconductor device of the seventh example according to the present invention, seen from axial direction of a cylindrical heat sink 70.

Figures 7A, 7B, 7D:
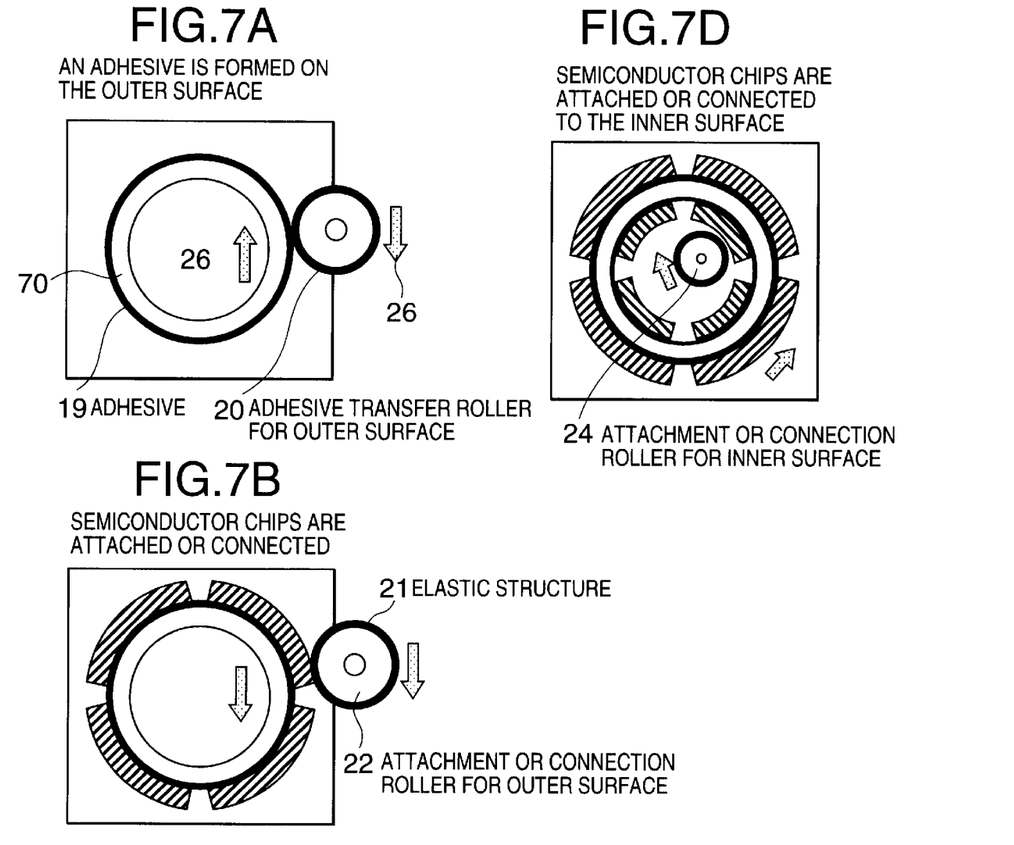
FIGS. 7A to 7D show a process of mounting a semiconductor chip on a curved surface, which is a method of manufacturing a three-dimensional semiconductor device of the seventh example according to the present invention, seen from axial direction of a cylindrical heat sink.

An adhesive 19 for attaching a semiconductor chip is formed on an outer peripheral surface of the cylindrical heat sink 70 as follows. First, the heat sink 70 is rotated on a central axis thereof. Then, the adhesive 19 is transferred to an outer curved surface adhesive transfer roller 20 for transferring an adhesive to an outer peripheral surface of the heat sink 70. The transfer roller 20 is rotated on in a reverse direction to that of the heat sink 70 while being in contact with the outer peripheral surface of the heat sink 70, whereby the adhesive 19 is transferred to a predetermined portion of the heat sink 70, as shown in FIG. 7A. An arrow 26 represents a rotation direction of the heat sink 70. The rotational direction of the transfer roller 20 can be the same as that of the heat sink 70.

Next, as shown in FIG. 7B, semiconductor chips are attached or connected to the outer peripheral surface of the heat sink 70 via the adhesive 19 by using an attachment or connection roller 22. The attachment or connection roller 22 is provided with an elastic structure 21 on outer peripheral surface. A semiconductor chip can be easily transferred from a wafer attachment ring to a heat sink 70. A wafer attachment ring has an attachment tape with one semiconductor chip or more. For example, if a semiconductor chip attached onto the tape is about 15 to 50 $\mu$m thick, the transfer of a chip to the attachment or connection roller 22, or to an adhesive layer of the adhesive 19 can easily done.

Figure 7C:
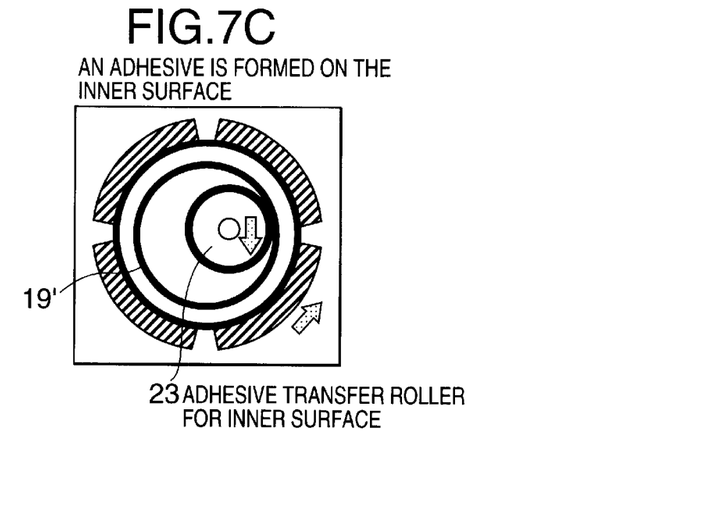

Next, as shown in FIG. 7C, [in the same way as in the outer peripheral surface,] an adhesive 19' is transferred to an inner peripheral surface of the heat sink 70 just as is an adhesive 19' transferred to an outer peripheral surface. By using an inner curved surface adhesive transfer roller 23 for transferring an adhesive to the inner peripheral surface of the heat sink 70. As shown in FIG. 7D, in the same way as in the outer peripheral surface, semiconductor chips are attached or connected to the inner peripheral surface of the heat sink 70 via the adhesive 19' by using an inner curved surface semiconductor chip attachment or connection roller 24. The roller 24 is provided with an elastic structure on an outer peripheral portion.

Example 8

Figure 8:
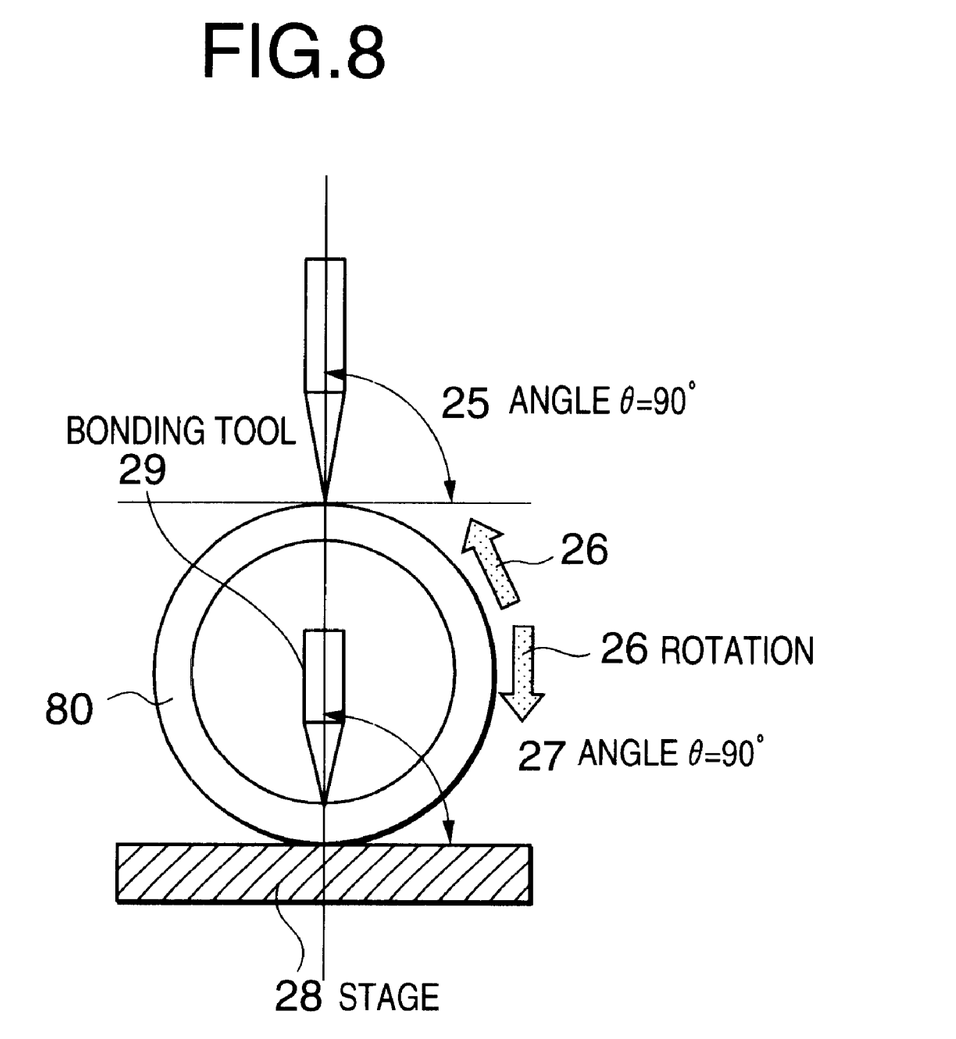
FIG. 8 is a schematic view illustrating a method of manufacturing a three-dimensional semiconductor device of the eighth example according to the present invention. More specifically.

FIG. 8 is a schematic view illustrating a method of manufacturing a three-dimensional semiconductor device of the eighth example according to the present invention. More specifically, FIG. 8 is a schematic view seen from axial direction of a cylindrical heat sink, illustrating a method for continuously bonding semiconductor chips on inner and outer peripheral curved surfaces of a cylindrical heat sink by flip-chip bonding. A heat sink 80 with a semiconductor chip connected thereto is rotated in either direction represented by an arrow 26. At a moment when a subsequent semiconductor chip is connected to the heat sink 80 by a bonding tool 29, the heat sink 80 and a stage 28 are stopped. In this state, a connection electrode or a circuit board of a semiconductor chip, a connection portion of a circuit board formed directly on the heat sink 80, and a bonding direction of the bonding tool 29 always form an angle $\theta=90°$ (denoted by reference numeral 27) with respect to the stage 28. This also applies to an outer peripheral curved surface. Rotation means (not shown) for rotating the heat sink 80 around a central axis of the cylinder has a function of always holding an angle $\theta=90°$ at a position of the heat sink 80 intended for connecting a semiconductor chip. Because of this function, stable connection of a semiconductor chip can be conducted even on a curved surface.

Example 9

Figure 9A:
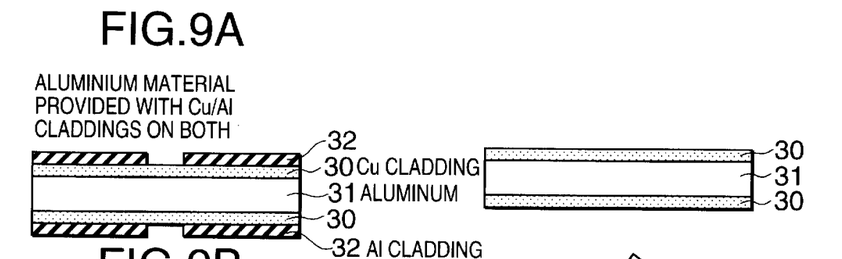
FIGS. 9A to 9C are cross-sectional views in a thickness direction of a heat sink or a heat sink circuit board in a process of forming a circuit board directly on a plate-shaped heat sink, showing a method of manufacturing a heat sink circuit board of the ninth example according to the present invention.
Figure 9B:
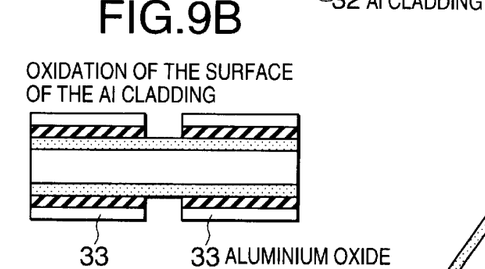
Figure 9C:
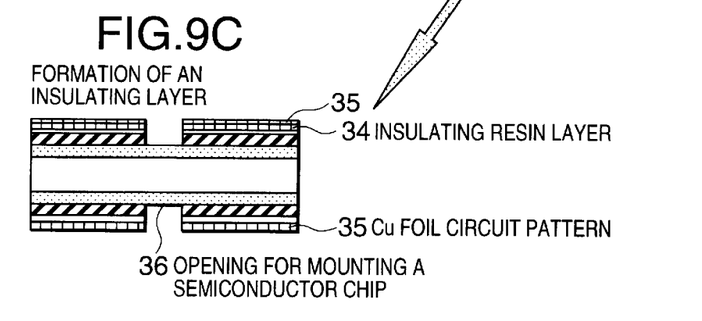

FIGS. 9A to 9C are cross-sectional views in a thickness A direction of a heat sink or a heat sink circuit board in a process of forming a circuit board directly on a plate-shaped heat sink, showing a method of manufacturing a heat sink circuit board of the ninth example according to the present invention. Referring to FIG. 9A, as a heat sink circuit board, a cladding material is used, in which Cu claddings 30 and aluminum claddings 32 are formed on an entire or a selective part of both surfaces of an aluminum material 31. Herein, the aluminum claddings 32 may be omitted. The surfaces of the aluminum claddings 32 are oxidized to form insulating layers of an aluminum oxide 33, as shown in FIG. 9B.

Furthermore, as shown in FIG. 9C, an insulating resin layer 34 is formed on the insulating layer of the aluminum oxide 33, a Cu foil is attached onto the insulating resin layer 34, and patterned by etching or laser processing, whereby a Cu foil circuit pattern 35 is formed. Thereafter, various kinds of metal layers are formed by a method for connecting a semiconductor chip, such as electroplating or electroless plating.

Because of the above-mentioned process, a circuit pattern can be easily formed directly on a heat sink. Therefore, a three-dimensional semiconductor device that is lightweight, thin, short, and small can be realized, in which packaging with high heat transfer and high density, and a high-speed operation are realized. Furthermore, an opening 36 for mounting a semiconductor chip can be easily provided, so that a semiconductor device can be mounted directly on this portion through low temperature solder or the like. As a result, a three-dimensional semiconductor device of a high power consumption type with a low heat resistance can be easily realized.

The effects of the three-dimensional semiconductor device of the examples according to the present invention are as follows. A circuit pattern is formed directly or indirectly on a metal heat sink, and a semiconductor device is mounted on the circuit pattern so as to be electrically and mechanically connected thereto. Therefore, high heat transfer can be expected, and miniaturization can be realized. Furthermore, a CPU is disposed on a substantially center of an inner bottom surface of a columnar heat sink, and semiconductor devices with a heat sink controlled by the CPU are disposed on an outer peripheral portion at a substantially equal distance from the CPU. Therefore, a wiring length becomes almost shortest, and the distance between the CPU and each semiconductor device becomes equal, which enables a high-speed operation to be conducted with a uniform balance.

Furthermore, in the case of a structure in which semiconductor devices are mounted on a curved surface, mounting on a special structure, such as mounting on inner and outer surfaces of a cylinder (particularly, an outer shape is limited), and mounting on an outer peripheral surface of a cylinder are made possible, whereby a mounting range and an applicable range can be enlarged. Furthermore, in an application of this structure, a CPU is placed on a substantially center of an inner bottom surface of a cylindrical heat sink, and semiconductor devices are mounted on inner and outer peripheral surfaces of an outer peripheral portion of the heat sink, whereby semiconductor devices with a heat sink controlled by the CPU are placed at an equal distance from the CPU, and a wiring length therebetween can be minimized. As a result, a high-speed operation with a further uniform balance can be conducted.

An outer shape including a heat sink can be rendered close to that of a semiconductor device, so that packaging with high heat transfer and high density can be realized. Furthermore, a package with a semiconductor device mounted thereon is attached directly to a mother board or a housing, so that heat can be transferred directly to the mother board or the housing, which further enhances a heat transfer effect. A semiconductor device is three-dimensionally mounted on one surface or both surfaces of a heat sink, so that a three-dimensional semiconductor device can be miniaturized, and a packaging with high heat transfer and high density can be realized. A circuit pattern is formed directly on a heat sink, so that the heat sink functions as a circuit board, and a special circuit board is not required. Consequently, a three-dimensional semiconductor device can be made light, thin, short, and small with a low cost and a low heat resistance.

The first effect of the three-dimensional semiconductor device of the present invention is miniaturization as well as high heat transfer. The reason for this is that the three-dimensional semiconductor device of the present invention has a three-dimensional shape allowing a plurality of semiconductor devices to be arranged in a columnar shape, and includes a supporting member mainly containing a high heat-conductive material and a plurality of semiconductor devices mounted on the supporting member. The second effect of the three-dimensional semiconductor device is as follows: the three-dimensional semiconductor device can be attached directly to a mother board or a housing, so that heat can be transferred directly to the mother board or the housing, whereby a heat transfer effect can be further enhanced. The reason for this is the same as that of the first effect.

The third effect of the three-dimensional semiconductor device of the present invention is that semiconductor devices controlled by the CPU can be placed at a substantially equal distance (in particular, substantially equal distance) from the CPU. The reason for this is that the supporting member of the three-dimensional semiconductor device includes a columnar structure (inparticular, cylindrical structure) having a bottom on one end, a CPU is mounted on an inner bottom surface of the cylindrical structure, and semiconductor devices controlled by the CPU can be mounted on at least one of an inner peripheral and an outer peripheral surface of the columnar structure. The fourth effect of the three-dimensional semiconductor device of the present invention is that a wiring length between the CPU and the semiconductor devices controlled by the CPU can be made short (in particular, shortest), which makes it possible to conduct a high-speed operation with a uniform (in particular, more uniform) balance. The reason for this is the same as that of the third effect.

The fifth effect of the three-dimensional semiconductor device of the present invention is that mounting of a semiconductor device on a special structure, such as mounting of a semiconductor device on inner and outer peripheral surfaces (in particular, an outer shape is limited) of a cylinder, and mounting of a semiconductor device on an outer peripheral surface of a cylinder can be made possible, and a mounting range and an applicable range are enlarged. The reason for this is that the supporting member of the three-dimensional semiconductor device has a three-dimensional shape allowing a plurality of semiconductor devices to be arranged in a columnar shape.

The sixth effect of the three-dimensional semiconductor device of the present invention is that the size of an outer shape of the three-dimensional semiconductor device is rendered close to that of a semiconductor device, and a packaging with high heat transfer and high density can be realized. The reason for this is that the supporting member of the three-dimensional semiconductor device of the present invention has a columnar structure, and a plurality of semiconductor devices are mounted on at least one of an inner peripheral surface and an outer peripheral surface of the columnar structure. The seventh effect of the three-dimensional semiconductor device of the present invention is that semiconductor devices can be three-dimensionally mounted on one surface or both surfaces of inner and outer peripheral surfaces of the columnar structure, whereby miniaturization of a three-dimensional semiconductor device, and a packaging with high heat transfer and high density can be realized. The reason for this is the same as that of the sixth effect.

The eighth effect of the three-dimensional semiconductor device of the present invention is as follows: the supporting member is allowed to function as a circuit board, which makes it unnecessary to provide a special circuit board, so that a three-dimensional semiconductor device can be made light-weight, thin, short, and small with a low cost and a low heat resistance. The reason for this is that a circuit pattern can be formed on the supporting member of the three-dimensional semiconductor device.

According to the method of manufacturing a three-dimensional semiconductor device of the present invention, the three-dimensional semiconductor device of the present invention that exhibits the above-mentioned effects can be easily produced. According to the apparatus for manufacturing a three-dimensional semiconductor device of the present invention, the three-dimensional semiconductor device of the present invention that exhibits the above-mentioned effects can be easily produced.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A three-dimensional semiconductor device comprising:
    a supporting member having a three-dimensional shape allowing a plurality of semiconductor devices to be arranged in a columnar shape and containing as a main component a high heat-conductive material;
    a plurality of semiconductor devices attached to the supporting member; and
    a central processing unit (CPU) attached to said supporting member,
    wherein a distance from said CPU to each of said semiconductor devices is substantially the same.

2. A three-dimensional semiconductor device according to claim 1, wherein a circuit pattern is formed on the supporting member via an insulating layer.

3. A three-dimensional semiconductor device package obtained by mounting the three-dimensional semiconductor device of claim 1 in a package.

4. The three-dimensional semiconductor device according to claim 1, wherein the supporting member includes a columnar structure.

5. The three-dimensional semiconductor device according to claim 4, wherein said plurality of semiconductor devices are attached onto at least one of an inner peripheral surface and an outer peripheral surface of the columnar structure.

6. The three-dimensional semiconductor device according to claim 4, wherein said plurality of semiconductor devices are attached onto an inner peripheral surface of the columnar structure.

7. The three-dimensional semiconductor device according to claim 4, wherein said plurality of semiconductor devices are attached onto an outer peripheral surface of the columnar structure.

8. The three-dimensional semiconductor device according to claim 1, wherein the supporting member is a Cu/Al cladding material.

9. The three-dimensional semiconductor device according to claim 8, wherein said Cu/Al cladding material includes a layered structure having a Cu cladding layer and an Al cladding layer on both sides so that the Al cladding layer becomes an outermost layer.

10. A three-dimensional semiconductor device according to claim 1, wherein the supporting member comprises:
   a columnar structure having a bottom on one end.

11. The three-dimensional semiconductor device according to claim 10, wherein the supporting member further comprises:
   a CPU attached onto an inner bottom surface of the columnar structure.

12. The three-dimensional semiconductor device according to claim 11, wherein the supporting member further comprises:
   a semiconductor device controlled by the CPU and attached onto at least one of an inner peripheral surface and an outer peripheral surface of the columnar structure.

13. The three-dimensional semiconductor device according to claim 12, wherein the supporting member further comprises:
   a heat sink on a surface of the CPU.

14. The three-dimensional semiconductor device according to claim 1, wherein the supporting member includes a curved surface, and
   wherein said semiconductor devices are mounted on said curved surface of said supporting member.

15. The three-dimensional semiconductor device according to claim 1, wherein the semiconductor devices are mounted on both an inner peripheral surface as well as an inner bottom surface of said supporting member.

16. The three-dimensional semiconductor device according to claim 1, wherein the semiconductor devices are mounted on an inner peripheral surface of said supporting member.

17. The three-dimensional semiconductor device according to claim 1, wherein the semiconductor devices are mounted on an inner bottom surface of said supporting member.

18. The three-dimensional semiconductor device according to claim 1, wherein the semiconductor devices are mounted on an outer peripheral surface and an inner bottom surface of said supporting member.

19. The three-dimensional semiconductor device according to claim 1, wherein the semiconductor devices are mounted on an outer peripheral surface of said supporting member.

20. A semiconductor structure including:
   a package including a three-dimensional semiconductor device according to claim 1; and
   at least one semiconductor device installed outside the package.

21. The three-dimensional semiconductor device according to claim 1, wherein the device is devoid of a channel for a cooling agent.

22. The three-dimensional semiconductor device according to claim 1, wherein a chip block is connected electrically and mechanically to a flat surface of said supporting member.

23. The three-dimensional semiconductor device according to claim 1, wherein the supporting member includes a curved surface.

24. A three-dimensional semiconductor device, comprising:
   a supporting member having a three-dimensional shape allowing a plurality of semiconductor devices to be arranged in a columnar shape and containing as a main component a high heat-conductive material; and
   a plurality of semiconductor devices attached to the supporting member,
   wherein the supporting member includes a columnar structure, and a plurality of semiconductor devices are attached onto at least one of an inner peripheral surface and an outer peripheral surface of the columnar structure.

25. A three-dimensional semiconductor device according to claim 24, wherein the supporting member is a Cu/Al cladding material including a layered structure having a Cu cladding layer and an Al cladding layer on both sides so that the Al cladding layer becomes an outermost layer.

26. A three-dimensional semiconductor device according to claim 24, wherein the supporting member comprising;
   a columnar structure having a bottom on one end;
   a CPU attached onto an inner bottom surface of the columnar structure;
   a semiconductor device controlled by the CPU and attached onto at least one of an inner peripheral surface and an outer peripheral surface of the columnar structure; and
   a heat sink on a surface of the CPU.

27. A three-dimensional semiconductor device according to claim 26, wherein the columnar structure comprising;
   a bottom on one end constructed watertightly so that a cooling medium for the semiconductor device can be stored in an cavity; and
   an at least one port or a plurality of inlet/outlet ports for supplying the cooling medium to the cavity or discharging the cooling medium from the cavity.

28. A three-dimensional semiconductor device, comprising:
   a supporting member having a three-dimensional shape allowing a plurality of semiconductor devices to be arranged in a columnar shape and containing as a main component a heat-conductive material, wherein the supporting member includes a curved surface; and
   a plurality of semiconductor devices mounted on said curved surface of said supporting member.

* * * * *